United States Patent [19]

Thürig et al.

[11] Patent Number: 6,100,880
[45] Date of Patent: Aug. 8, 2000

[54] CONSUMPTION METER WITH MEMORY, DISPLAY, AND CONTACT-LESS SUPPLY OF ENERGY FROM EXTERIOR WHEN EXTERNAL POWER SUPPLY VOLTAGE IS ABSENT

[75] Inventors: Andreas Thürig, Cham; Gerhard Berner, Zug; Bruno Ricciardi, Ebikon, all of Switzerland

[73] Assignee: Siemens Metering AG, Zug, Switzerland

[21] Appl. No.: 08/993,697

[22] Filed: Dec. 18, 1997

[30] Foreign Application Priority Data

Jan. 31, 1997 [CH] Switzerland ................................. 202/97

[51] Int. Cl.[7] ............................ G09G 5/00; G01R 31/00; G01R 21/00
[52] U.S. Cl. ................................. 345/211; 702/58; 702/61
[58] Field of Search ..................................... 345/211, 212; 702/58, 60, 61, 62; 364/528.26, 528.3, 528.33, 187, 184; 340/870.02, 637; 365/228, 229; 361/659, 661, 662, 663; 136/243

[56] References Cited

U.S. PATENT DOCUMENTS

| 4,017,725 | 4/1977 | Roen ........................................ 361/680 |
| 4,095,217 | 6/1978 | Tani et al. .................................. 345/87 |
| 4,197,582 | 4/1980 | Johnston et al. ........................... 702/58 |
| 4,298,839 | 11/1981 | Johnston ............................. 340/870.02 |
| 4,355,361 | 10/1982 | Riggs et al. ........................ 364/528.33 |
| 4,584,527 | 4/1986 | Amigo ................................ 340/870.02 |
| 4,823,928 | 4/1989 | Speas ........................................ 194/217 |
| 4,987,363 | 1/1991 | Gibbs et al. ........................ 364/528.27 |
| 5,185,700 | 2/1993 | Bezos et al. ........................ 340/870.41 |
| 5,197,291 | 3/1993 | Levinson ..................................... 62/3.2 |
| 5,216,357 | 6/1993 | Coppola et al. .......................... 365/229 |
| 5,260,885 | 11/1993 | Ma ........................................... 361/681 |
| 5,339,091 | 8/1994 | Yamazaki et al. ....................... 345/104 |
| 5,523,776 | 6/1996 | Hougham et al. ....................... 345/211 |
| 5,555,508 | 9/1996 | Munday et al. ........................... 702/60 |

FOREIGN PATENT DOCUMENTS

| 41 39 011 A1 | 6/1992 | Germany . |
| 41 07 452 C1 | 7/1992 | Germany . |
| 2 017 937 | 10/1979 | United Kingdom . |

Primary Examiner—Steven J. Saras
Assistant Examiner—Paul A. Bell
Attorney, Agent, or Firm—Proskauer Rose LLP

[57] ABSTRACT

An arrangement such as a consumption meter has an external power supply. The is provided with an electronic display and/or a communication interface for reading and/or writing a content of a memory. When the external supply voltage is absent at least the electronic display and/or the communication interface as well as an electronic write/read device of the memory are supplied with energy from the exterior by a contact-less power supply, for example by means of a solar cell. Thus the content of the memory can be read and/or parametrised without the presence of a mains voltage, without a battery, without troublesome connections for an external voltage source and for example in the case of electricity meters without destroying security seals.

9 Claims, 1 Drawing Sheet

CONSUMPTION METER WITH MEMORY, DISPLAY, AND CONTACT-LESS SUPPLY OF ENERGY FROM EXTERIOR WHEN EXTERNAL POWER SUPPLY VOLTAGE IS ABSENT

BACKGROUND OF THE INVENTION

1. Field of the Invention

The invention relates to an externally supplied arrangement having an electronic display and/or a communication interface.

In a preferred embodiment of the invention, the arrangement is any measuring, tariff or recording apparatus but preferably a gas, water or power consumption measuring apparatus such as for example an electronic electricity meter. The arrangement has an electronic display which displays measured, calculated and/or other variable parameter values stored in the memory. In the case of electricity meters the measured parameter values are for example energy, power, voltage or current values while for example there is a customer number as another variable parameter value, that number differing from one electricity meter to another. The parameter values are stored in a memory in the arrangement and, in addition to the display or also in place of the display, can also be transmitted to the exterior, for example for remote reading, by way of a communication interface.

2. Description of the Prior Art

In operation of a known such arrangement energy is generally supplied to the arrangement from an electrical power supply mains. In certain cases, for example in the event of a mains failure, on building sites, in a situation involving seasonal operation, in locomotives with retracted current collector or during storage, the electrical power supply mains is not yet connected or is not yet switched-on so that the electronic display and the communication interface are relatively worthless as electrical energy is required to permit them to be read or for operation thereof. In all those cases the stored parameter values can therefore be read only when the arrangement is supplied with energy from the electrical power supply network. That is in contrast to arrangements equipped with a mechanical counting mechanism in which the displayed parameter value is readily readable in all the above-indicated situations (mains failure, building site, seasonal operation, locomotive, storage) because, as is known, no electrical power supply is required for a mechanical display and for reading thereof.

The use of batteries is unusual in such arrangements which are generally operated over a long-term period of operation, for example for a period of ten years, and - by virtue of possible discharging of the batteries—involves difficulties in the course of time. For the same reason it is not very sensible for the arrangement already to be fitted with a battery during storage.

It is conventional that such arrangements, especially when used as consumption meters are sealed. As is known security seals protect electricity meters from unauthorised manipulation. In that situation a lead-sealed cover prevents the electricity meter from being accessible for a direct supply from the exterior, without destruction of the security seal.

An electronic electricity meter provided with a solar cell is known from US-A-5 197 291, in which the electronic system is supplied by a battery which, to ensure battery power when the arrangement is subjected to the effect of solar radiation, is cooled by a cooling assembly which is powered by a solar cell.

SUMMARY OF THE INVENTION

An object of the present invention is to provide an arrangement having an external power supply an electronic display and/or a communication interface, and a memory in which the memory content can be at least partially read and/or written—from near and/or far—without the energisation of the external power supply, without the presence of a battery, and without troublesome connections for an external voltage source. Another object of the invention is to provide such an arrangement in which the memory can be read and/or written without destroying security seals.

According to the invention there is provided an arrangement having: an external power supply for supplying an external supply voltage; a memory; a read/write device for reading data from the memory and writing data to the memory; an electronic display for displaying the contents of the memory; and/or a communication interface for reading data from and/or writing data to the memory, and means for the contact-less supply of energy from the exterior of the arrangement to at least the read write device and the display and/or interface when the said external supply voltage is absent.

BRIEF DESCRIPTION OF THE DRAWINGS

The above and other objects, features and advantages of the invention will be apparent from the following detail description of illustrative embodiments which is to be read in connection with the accompanying drawings, in which.

DETAILED DESCRIPTION OF THE PREFERRED EMBODIMENT

Figure 1:
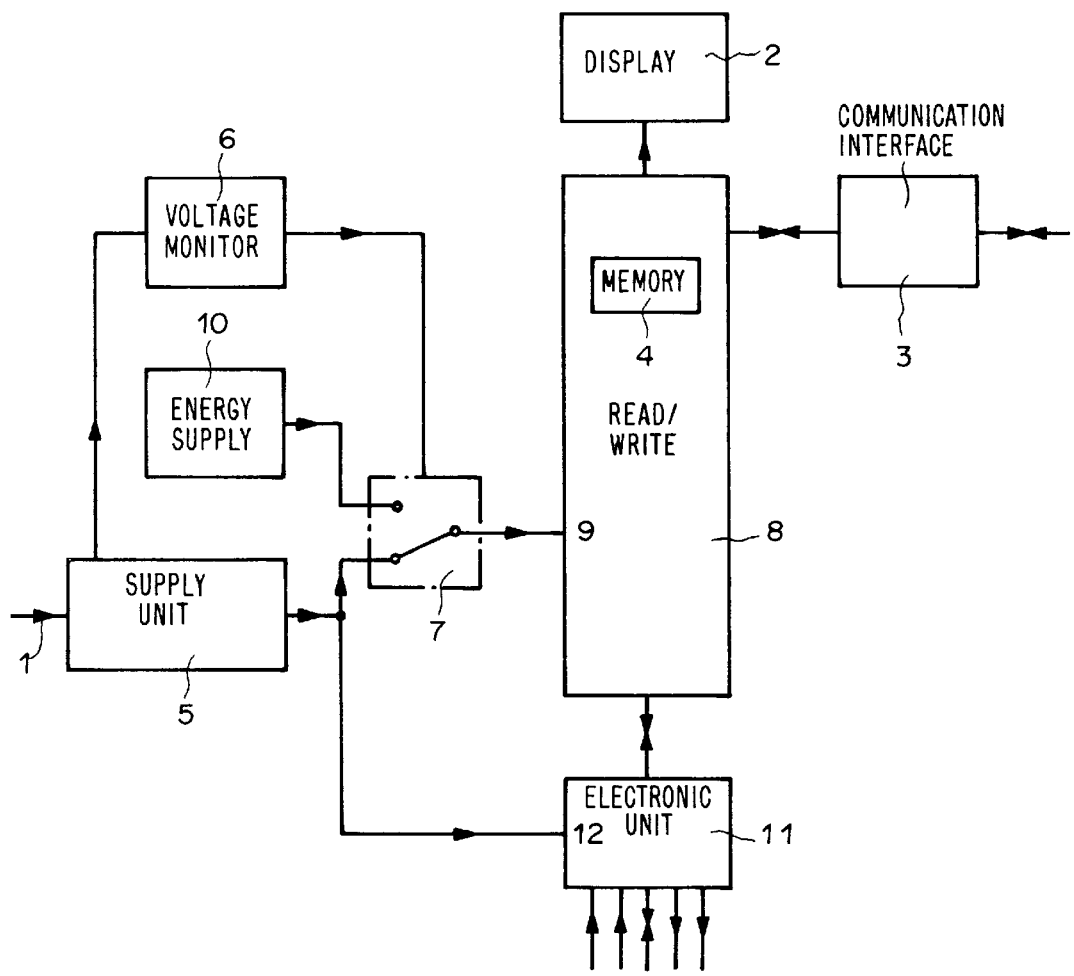
FIG. 1 illustrates an embodiment of the invention.

Referring to FIG. 1, an arrangement is any measuring, tariff or recording apparatus but preferably a gas, water or power consumption measuring apparatus such as for example an electronic electricity meter. The arrangement has an electronic display 2 which displays measured, calculated and/or other variable parameter values stored in the memory. In the case of electricity meters the measured parameter values are for example energy, power, voltage or current values while for example there is a customer number as another variable parameter value, that number differing from one electricity meter to another. The parameter values are stored in a memory 4 in the arrangement and, in addition to the display 2 or also in place of the display, can also be transmitted to the exterior, for example for remote reading, by way of a communication interface 3. The parameters values may be written into the memory 4 to bring the arrangement into operation. The arrangement is normally sealed in a housing, with a lead seal, especially if the arrangement is a gas, electricity or water consumption meter. The conductors for the electrical supply voltage extend through the housing. The arrangement is supplied with an electrical supply voltage 1 via conductors from the exterior. The arrangement also includes the electronic display 2 for displaying the contents of the memory and/or the communication interface 3 which is for reading and/or writing the content of the memory 4 via a read/write device 8. Preferably, and as shown in the Figure, the arrangement has both the display 2 and the communication interface 3.

The arrangement also comprises an electronic unit 11. The electronic unit 11 performs all the metering operations of the arrangement. Such apparatus are known and will not be described herein. The electronic unit 11 includes all those electronics and all those functions which are not required for reading and/or writing of the memory 4 via the communications interface 3.

The supply voltage 1 is preferably ac voltage provided by the ac mains network and supplies a supply unit 5 in which the ac voltage is converted into one or more dc voltages of which at least one is fed to a voltage monitoring means 6. The voltage monitoring means 6 indirectly monitors by way of the dc voltage the existence or absence of the supply voltage 1 and in the event of absence thereof switches over a change-over switch 7 whose control input is connected to an output of the voltage monitoring means 6. In the event of absence of the supply voltage 1 the change-over switch 7 switches an input 9 of the electronic write/read device 8 from an output of the supply unit 5 to an output of a device 10 for contact-less supply of energy to a portion 2, 3, 8 of the arrangement, which portion comprises at least the electronic display 2, the communication interface 3 and the electronic write/read device 8 of the memory 4. The output of the supply unit 5 is connected to a supply input 12 of the electronic unit 11 so that when supply voltage 1 is present the electronic unit 11 is supplied exclusively by the supply unit 5 which in that case, by way of the change-over switch 7, also supplies the portion 2, 3, 8 of the arrangement with energy. In contrast the electronic unit 11 is never supplied with energy by the device 10. In other words: in normal operation the entire arrangement, 1–12 shown in the Figures, is automatically supplied with energy by the supply voltage 1 by way of the supply unit 5. If for any reason the supply voltage 1 is not present, the arrangement is automatically switched by the voltage monitoring means 6 by means of the change-over switch 7 into an energy saving mode in which the energy consumption of the arrangement is reduced to a minimum. In that case the supply of energy for the electronic display 2, the communication interface 3 and the write/read device 8 is exclusively from the device 10 if this is supplied with energy from the exterior in a contact-less mode, while the electronic unit 11 is not supplied with energy at all and is thus out of operation, for saving energy.

In a preferred embodiment of the invention when the supply voltage 1 is not present, at least the electronic display 2, the communication interface 3 and the electronic write/read device 8 of the memory 4 are switched by means of the voltage monitoring means 6 and the change-over switch 7 into a low energy consumption mode or low power mode. The display 2, interface 3, and read/write device 8 and preferably the memory may be implemented using CMOS technology. A clock (not shown) is provided. To implement the low power made in one embodiment of the invention, the frequency of the clock is very greatly reduced when the supply voltage 1 is not present, in order to reduce the level of energy consumption, as at a low frequency the level of energy consumption of the portion 2; 3; 8 of the arrangement which remains in operation and which is generally produced using CMOS-technology is much lower than at the higher clock frequency which is used in normal operation.

In the Figure the change-over switch 7 is illustrated in the form of an electromechanical change-over switch. It is however appreciated that it may also be a semi-conductor change-over switch which is formed by means of transistors or so-called transmission gates. It may also comprise for example two diodes which are connected together in an OR-circuit, wherein the two interconnected cathodes of the diodes form an output of the change-over switch 7 which is taken to the input 9 of the electronic write/read device 8 while the anode of each of the two diodes is respectively connected to the output of the supply unit 5 and the device 10. In that case the change-over switch 7 does not have a control input.

In one illustrative embodiment of the arrangement according to the invention the device 10 is a solar cell with or without a buffer memory. In that embodiment, when there is no supply voltage 1, at least the electronic display 2 the communication interface 3 and the electronic write/read device 8 of the memory 4 are supplied with energy from the exterior in a contact-less mode by means of the solar cell when the solar cell is irradiated. The latter in the extreme case may be effected by means of a flashlight. In this embodiment therefore the supply energy is supplied in a contact-less mode by means of light and when the solar cell is irradiated the content of the memory 4 can be read on site by means of the electronic display 2 and/or remotely by means of the communication interface 3. In addition, with the solar cell irradiated, it is possible to write to the memory 4 or to alter the content of the memory 4, for example for freshly parametrising or re-parametrising the arrangement, from near and/or from afar.

In a second illustrative embodiment of the arrangement according to the invention the device 10 for the contact-less supply of energy is of such a configuration that, when the external supply voltage 1 is missing, at least the electronic display 2 and/or the communication interface 3 and the electronic write/read device 8 of the memory 4 are supplied with energy from the exterior inductively in a contact-less manner.

In a third illustrative embodiment of the arrangement according to the invention the device 10 for the contact-less supply of energy is of such a configuration that, when the external supply voltage 1 is missing, at least the electronic display 2 and/or the communication interface 3 and the electronic write/read device 8 of the memory 4 are supplied with energy from the exterior capacitively in a contact-less manner.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

For example, it is not essential to provide both the display 2 and the interface 3. One may be omitted: for example the display 2 may also be omitted. The voltage monitor 6 may be omitted.

We claim:

1. A consumption meter, comprising:
   (a) an external power supply for supplying an external supply voltage to said meter;
   (b) a memory;
   (c) a read/write device for reading data from or writing data to said memory;
   (d) an electronic display for displaying the contents stored in said memory; and
   (e) a device for contact-less supply of energy from the exterior of said meter to at least said read/write device and said electronic display when the external supply voltage is absent.

2. The meter according to claim 1, further comprising a communication interface connected to said memory wherein said contact-less energy supply device also supplies energy to said communication interface when the external supply voltage is absent.

3. The meter according to claim 1 wherein said contact-less energy supply device comprises a solar cell.

4. The meter according to claim 1 wherein said contact-less energy supply device comprises an inductor, which, when the external supply voltage is absent, supplies energy to at least said read/write device and said electronic display.

5. The meter according to claim 1 wherein said contact-less energy supply device comprises a capacitor.

6. The meter according to claim 1 wherein, when the external supply voltage is absent, at least said read/write device and said display are switched to a low energy consumption mode.

7. The meter according to claim 1 which is an electricity meter.

8. The meter according to claim 1, further comprising a switch for coupling at least said read/write device and said display to said contact-less energy supply device when the external supply voltage is absent.

9. The meter according to claim 8 wherein said switch also couples a communication interface connected to said memory to said contact-less energy supply device when the external supply voltage is absent.

* * * * *